(12) United States Patent
In et al.

(10) Patent No.: US 7,528,606 B1
(45) Date of Patent: May 5, 2009

(54) COUPLED NONLINEAR SENSOR SYSTEM FOR SENSING A TIME-DEPENDENT TARGET SIGNAL AND METHOD OF ASSEMBLING THE SYSTEM

(75) Inventors: Visarath In, Chula Vista, CA (US); Antonio Palacios, San Diego, CA (US); Yong Ko, San Diego, CA (US); Adi R. Bulsara, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 147 days.

(21) Appl. No.: 11/732,678

(22) Filed: Apr. 4, 2007

(51) Int. Cl.
*G01B 3/08* (2006.01)
*G01R 33/04* (2006.01)

(52) U.S. Cl. .................. 324/326; 324/207.16; 324/253

(58) Field of Classification Search ............ 324/207.11, 324/207.12, 207.15, 207.16, 207.17, 207.26, 324/253, 330, 331, 345, 326; 702/150–153
See application file for complete search history.

(56) References Cited

U.S. PATENT DOCUMENTS

| 2,428,014 | A | * | 9/1947 | Curry, Jr. et al. ............ 324/253 |
| 6,031,377 | A | | 2/2000 | Watkins |
| 6,880,400 | B1 | | 4/2005 | Fogliatti et al. |
| 6,947,504 | B1 | | 9/2005 | Pettit |
| 7,009,392 | B2 | | 3/2006 | Robinson |
| 2003/0052684 | A1 | * | 3/2003 | Nelson et al. ............... 324/329 |

OTHER PUBLICATIONS

In, Visarath et al., Coupling Nonlinear Sensors for Enhanced Sensitivity; A Prototype Using 3 Coupled-Core Fluxgate Magnometer, Sensors 2005 IEEE, pp. 57-59.*
U.S. Appl. No. 10/874,009, In, Visarath et al.
Bulsara, Adi R., et al., "Emergent Oscillations In Unidirectionally Coupled Overdamped Bistable Systems", Physical Review, Sep. 3, 2004, pp. 1-12, vol. E 70, 0361203, The American Physical Society, USA.
Bulsara, Adi R., et al., "Signal Detection Via Residence-Time Asymmetry In Noisy Bistable Devices", Physical Review, Jan. 31, 2003, pp. 1-21, vol. E 67, 016120, The American Physical Society, USA.
Bulsara, Adi R., et al., "Dynamic Cooperative Behavior In A Coupled-Core Fluxgate Magnetometer", International Symposium On Circuits And Systems, IEEE, Feb. 2006, pp. 5171-5174.

(Continued)

*Primary Examiner*—Kenneth J Whittington
(74) *Attorney, Agent, or Firm*—Kyle Eppele; Ryan J. Friedl

(57) ABSTRACT

A coupled non-linear sensor system is provided for sensing a non-sinusoidal time-dependent target signal. The system comprises an odd number, other than one, of interconnected oscillatory sensors for sensing time-dependent changes in an external magnetic flux generated by the non-sinusoidal time-dependent target signal, the sensors coupled to each other by a coupling parameter characterized by a threshold value, so that each of the sensors oscillates in the presence of the non-sinusoidal time-dependent target signal as the coupling parameter exceeds the threshold value.

24 Claims, 10 Drawing Sheets

OTHER PUBLICATIONS

In, Visarath, et al., "Self-Induced Oscillations In Coupled Fluxgate Magnetomer: A Novel Approach To Operating The Magnetic Sensors", IEEE, Proceedings of the 2004 International Symposium on Circuit and Systems 4. (2004)736-739.

In, Visarath et al., Complex Dynamics in Unidirectionally Coupled Overdamped Bistable Systems Subject to a Time-Periodic External Signal, Physical Review E 72, Oct. 25, 2005, pp. 045104-1 through 045104-4, The American Physical Society.

* cited by examiner

COUPLED NONLINEAR SENSOR SYSTEM FOR SENSING A TIME-DEPENDENT TARGET SIGNAL AND METHOD OF ASSEMBLING THE SYSTEM

STATEMENT REGARDING FEDERALLY SPONSORED RESEARCH OR DEVELOPMENT

The invention claimed herein may be manufactured and used by or for the Government of the United States of America for governmental purposes without payment of any royalties thereon or therefor. This application and any patent issuing thereon is assigned to the United States Government and is available for licensing for commercial purposes. No license is necessary when used for Governmental purposes. Licensing and technical inquiries may be directed to the Office of Patent Counsel, Space and Naval Warfare Systems Center, Code 20012, San Diego, Calif., 92152.

BACKGROUND OF THE INVENTION

Fluxgate magnetometers detect localized changes to the earth's magnetic field caused by presence of ferrous objects. In general, fluxgate magnetometers are of two common configurations. These two configurations are commonly referred to in the art as "core-type" and "ring-type". In this regard, "core-type" fluxgate magnetometers include a cylindrically-shaped ferromagnetic core while "ring-type" fluxgate magnetometers include a torodial-shaped ferromagnetic core. Wrapped about the core are an excitation coil and a sensor coil. The excitation coil excites the core to produce a magnetic flux. The sensor coil senses changes in the magnetic flux due to presence of a nearby ferromagnetic object. It will be observed that the discussion hereinbelow is with respect to core-type fluxgate magnetometers. However, it should be understood by those skilled in the art that the same physical principles generally apply to ring-type fluxgate magnetometers, as well.

Although prior art fluxgate magnetometers function adequately for their intended purpose, there are problems associated with magnetic flux measurements not addressed by these prior art devices. For example, a problem overlooked by such prior art devices is that, although they will detect presence of a ferrous object, these prior art devices may not uniquely identify the object.

Another problem not addressed by such prior art devices is lack of a convenient means for enhancing resolution of the detected signal due to presence of the ferrous object.

Yet another problem apparently not addressed by prior art devices is the inability of such prior art devices to produce oscillations (necessary for magnetic signal detection) with reduced power consumption.

A further problem not addressed by prior art devices is the inability of prior art devices to suitably detect time-dependent (i.e., AC) target signals.

Therefore, what is needed is a system including oscillatory fluxgate magnetometers, and a method of assembling the system, the system capable of oscillating in response to time-dependent (i.e., A.C.) changes in an external magnetic flux generated by a target signal in order to detect the target signal with enhanced resolution and lower power consumption.

BRIEF SUMMARY OF EMBODIMENTS OF THE INVENTION

A coupled nonlinear sensor system is provided for sensing a time-dependent target signal, comprising an odd number, other than one, of interconnected oscillatory sensors for sensing time-dependent changes in an external magnetic flux generated by the target signal, the sensors coupled to each other by a coupling parameter having a threshold value, so that each of the sensors oscillates in the presence of the target signal as the coupling parameter exceeds the threshold value.

According to another embodiment of the coupled nonlinear sensor system, a method of assembling the coupled nonlinear sensor system is provided for sensing a time-dependent target signal, comprising the step of interconnecting an odd number, other than one, of oscillatory sensors for sensing time-dependent changes in an external magnetic flux generated by the target signal, the sensors coupled to each other by a coupling parameter having a threshold value, so that each of the sensors oscillates in presence of the target signal as the coupling parameter exceeds the threshold value.

BRIEF DESCRIPTION OF THE SEVERAL VIEWS OF THE DRAWINGS

While the specification concludes with claims particularly pointing-out and distinctly claiming the subject matter of the present embodiments of the invention, it is believed the present embodiments of the invention will be better understood from the following description when taken in conjunction with the accompanying drawings wherein:

DETAILED DESCRIPTION OF EMBODIMENT(S) OF THE INVENTION

The subject matter of this patent specification is directed in particular to elements forming part of, or cooperating more directly with, a system and method in accordance therewith. It is to be understood that elements not specifically shown or described may take various forms well known to those skilled in the art.

Figure 1:
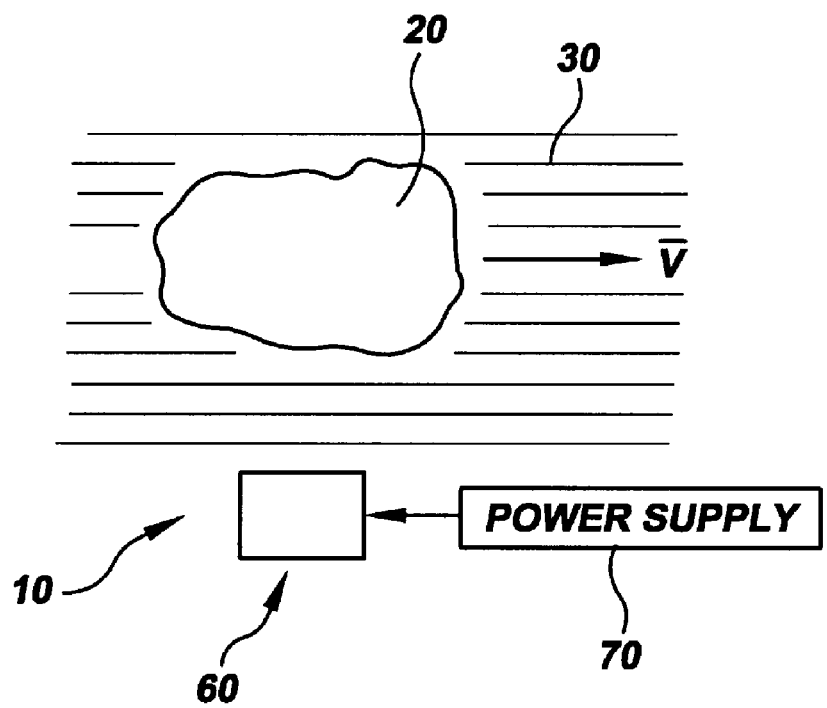
FIG. 1 is a schematic representation of a system for detecting a ferromagnetic object moving through a magnetic field with an average velocity V.
Figure 2:
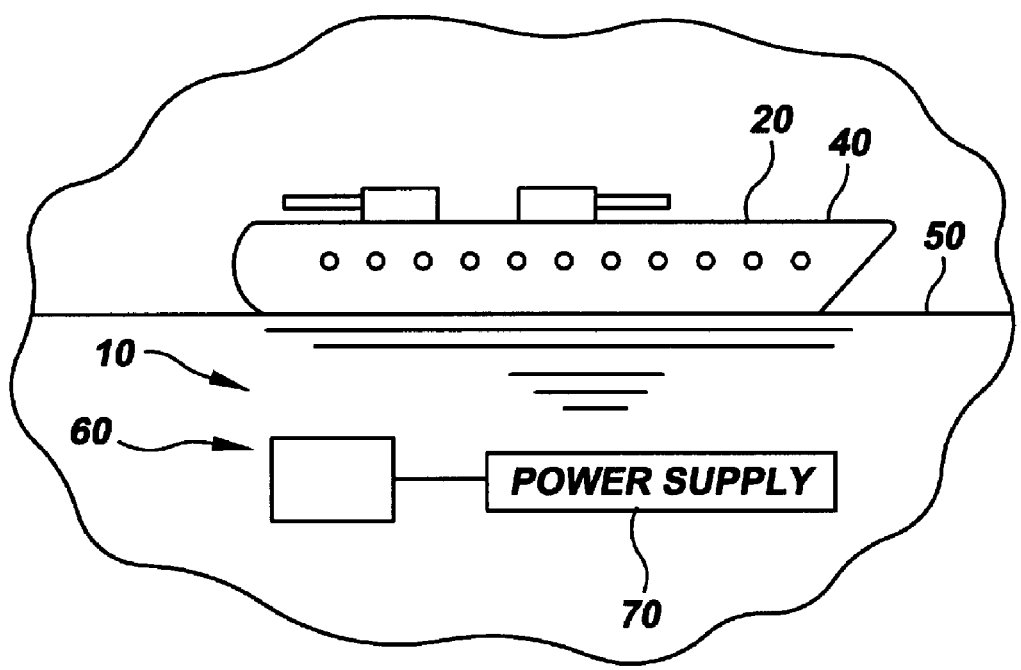
FIG. 2 illustrates the system poised to detect a boat moving on a body of water.

Therefore, referring to FIGS. 1 and 2, there is illustrated a coupled nonlinear sensor system, generally referred to as 10, for sensing a time-dependent target signal caused by a ferromagnetic object 20 moving through a magnetic field 30. By way of example only, and not by way of limitation, object 20 may be a warship 40 afloat on a body of water 50. It will be appreciated by those skilled in the art that ferromagnetic object 20 may be any metal object in any environment. That is, object 20 may be concealed unexploded ordinance made of ferrous materials and disposed at sea or on land; buried metal artifacts in archeological excavations; buried metal storage tanks having materials therein that may present environmental risks; iron ore deposits; a concealed metal object on a person's body; as well as other objects made, at least in part, of a ferromagnetic material. Moreover, system 10 also may be used for measurement of the earth's magnetic field; sensing of AC fields generated by power lines; conducting marine geomagnetic surveys; and as a component of sea, land, and space navigation systems. As described more fully hereinbelow, system 10 is used to detect and quantify weak time-dependent AC (Alternating Current) target signals produced by any of these ferromagnetic objects. As described more fully hereinbelow, system 10 comprises a sensor module, generally referred to as 60, that is powered by a power supply 70. Power supply 70 may be a direct current (DC) battery or an AC power source, if desired.

Figure 3:
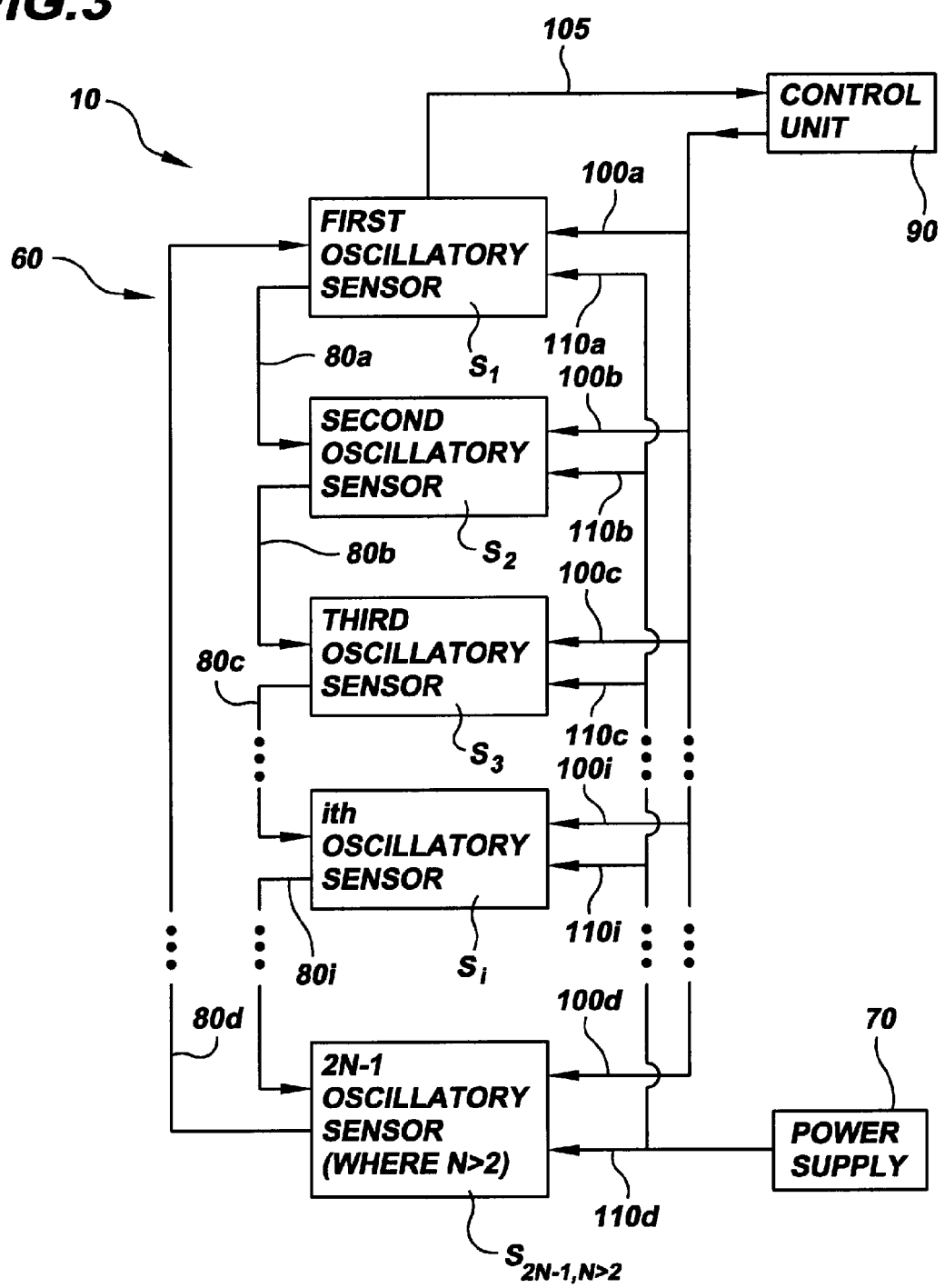
FIG. 3 is a generalized functional block diagram of the system comprising an odd number of oscillatory sensors.

Referring to FIG. 3, sensor module 60 comprises an odd number of coupled sensors $S_i$, where "i" ranges from i=1 to i=2N−1 and where N>2. As described in more detail hereinbelow, the odd number of coupled sensors $S_i$ comprises a first oscillatory sensor $S_1$ that generates a first output signal 80*a*. First output signal 80*a* is received by a second oscillatory sensor $S_2$. The second oscillatory sensor $S_2$ generates a second output signal 80*b*. Second output signal 80*b* is received by a third oscillatory sensor $S_3$, which generates a third output signal 80*c*. Third output signal 80*c* is received by the "ith" oscillatory sensor $S_i$. The "ith" oscillatory sensor $S_i$ generates an "ith" output signal 80*i* that is received by a downstream oscillatory sensor, which may be the final oscillatory sensor $S_{2N-1, for\ N>2}$. Sensor $S_{2N-1, for\ N>2}$ generates an output signal 80*d* that is received by first oscillatory sensor $S_2$. A control unit 90 controls operation of first oscillatory sensor $S_1$, second oscillatory sensor $S_2$, third oscillatory sensor $S_3$, the "ith" oscillatory sensor $S_i$ and the last oscillatory sensor $S_{2N-1, for\ N>2}$. In this regard, control unit 90 generates a first control unit signal 100*a*, a second control unit signal 100*b*, a third control unit signal 100*c*, an "ith" control unit signal 100*i* and a last control unit signal 100*d* that are received by first oscillatory sensor $S_1$, second oscillatory sensor $S_2$, third oscillatory sensor $S_3$, the "ith" oscillatory sensor $S_i$, and the last oscillatory sensor $S_{2N-1, for\ N>2}$, respectively. It may be appreciated that, in order to perform its control function, control unit 90 requires a feedback signal from sensor module 60. To accomplish this result, a feedback signal 105 is received by control unit 90 from first oscillatory sensor $S_1$. Moreover, power must be supplied to module 60. In order to provide power to sensor module 60, power supply 70 generates a first power supply signal 110*a*, a second power supply signal 110*b*, a third power supply signal 100*c*, an "ith" power supply signal 110*i* and a final power supply signal 110*d* to first oscillatory sensor $S_1$, second oscillatory sensor $S_2$, third oscillatory sensor $S_3$, the "ith" oscillatory sensor $S_i$, and the last oscillatory sensor $S_{2N-1, for\ N>2}$, respectively. Also, all the sensors $S_1$, $S_2$, $S_3$, the "ith" oscillatory 24 sensor $S_i$, and the last oscillatory sensor $S_{2N-1, for\ N>2}$ are "matched". The terminology "matched" is defined herein to mean that all the sensors are substantially identical with respect to electromagnetic properties and ability to detect magnetic flux.

Figure 4:
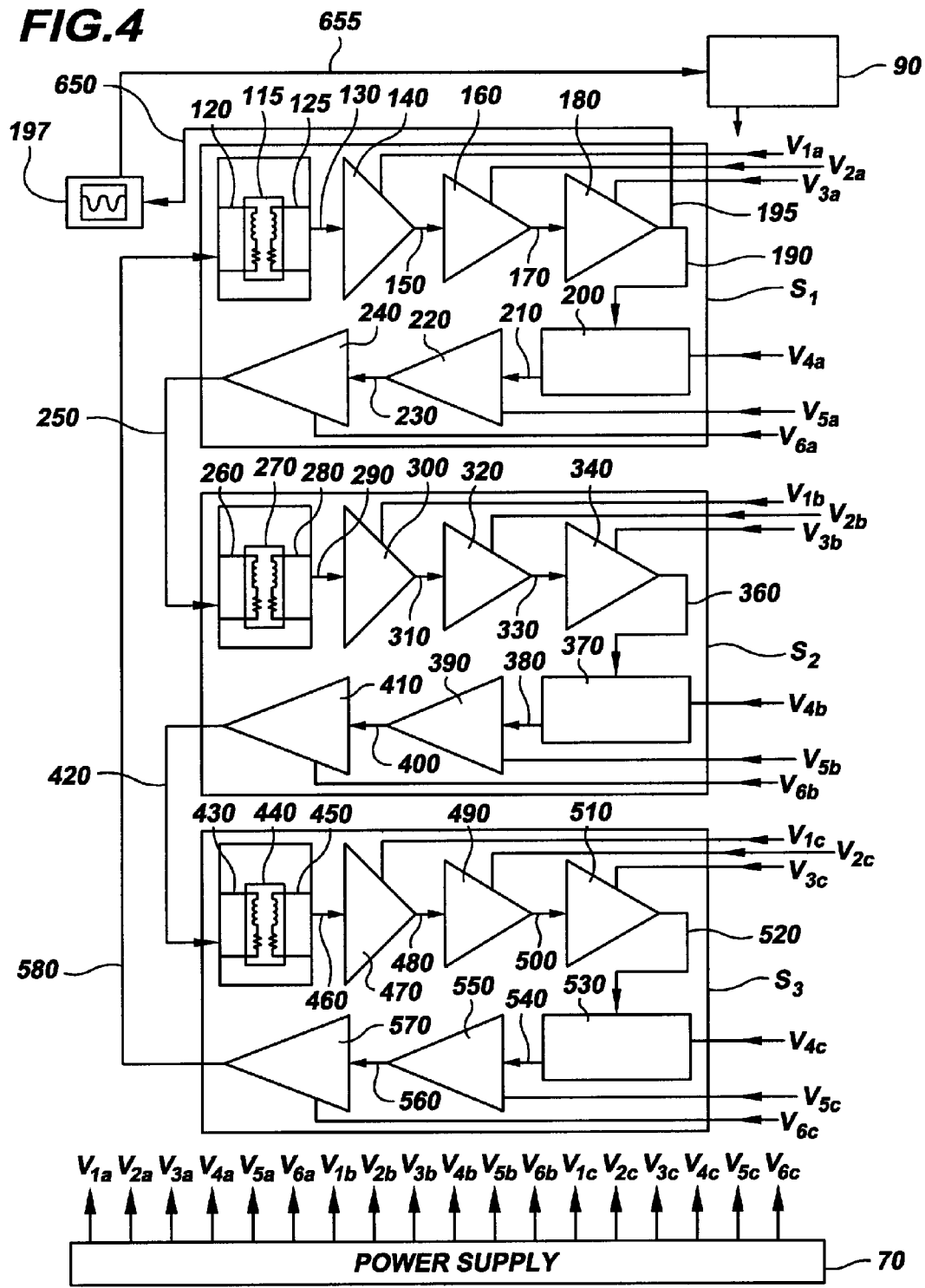
FIG. 4 is a specific example of the functional block diagram of the system shown in FIG. 3, wherein there are three oscillatory sensors in the specific example.

Turning now to FIG. 4, there is seen a specific example of the system 10 that is shown in FIG. 3. In this regard, first oscillator sensor $S_1$ comprises a first ferromagnetic core 115. Wound about first ferromagnetic core 115 is a first driver coil 120 for exciting first core 115 in order to generate a magnetic flux. Also, wound about first core 115 and interposed between windings of first driver coil 120 is a first sensor coil 125. First sensor coil 125 is in sensing relationship with the magnetic flux for sensing changes in the magnetic flux and for generating a first sensor coil output signal 130 in response thereto. A first amplifier 140 is electrically connected to first sensor coil 120 for receiving and amplifying first sensor coil output signal 130 in order to generate a first amplifier output signal 150. In this regard, first amplifier 140 "trims-out" any DC in sensor coil output signal 130. A first current-to-voltage converter 160 is electrically connected to first amplifier 140 for receiving the first amplifier output signal 150 and converting an electrical current thereof to a voltage to generate a first converter voltage output signal 170. A first integrator 180 is electrically connected to first current-to-voltage converter 160 for receiving and integrating the first converter output signal 170. First integrator 180 generates a first integrator output signal 190. A monitor signal 195 from first integrator 180 may be received by a monitor or display 197 for displaying first integrator output signal 190. In any event, a first "high-pass" filter 200 is connected to first integrator 180 for receiving and filtering first integrator output signal 190. In this regard, first filter 200 removes residual DC that may have leaked past first integrator 180. First filter 200 generates a first filter output signal 210. As well known in the art, a "high-pass" filter, such as a Sallen-Key second-order high pass filter, is a filter that passes high frequencies, but blocks frequencies lower than a cutoff frequency. In other words, it is known that such a filter blocks unwanted low frequency components of a complex signal while passing higher frequencies. Thus, such a high-pass filter with low cutoff frequency blocks DC from a signal and passes the remaining portion of the signal. A second amplifier 220 is electrically connected to first filter 200 for receiving and amplifying first filter output signal 210 and for generating a second amplifier output signal 230. A first voltage-to-current converter 240 is electrically connected to second amplifier 220 for receiving the amplified filter output signal 210 and for converting the voltage thereof into a current. In this manner, first voltage-to-current converter 240 converts the voltage into a current in order to generate a first voltage-to-current converter output signal 250.

Still referring to FIG. 4, the first voltage-to-current converter output signal 250 generated by first voltage-to-current converter 240 is received by a second driver coil 260 that belongs to second oscillatory sensor $S_2$. In this regard, second oscillator sensor $S_2$ comprises a second ferromagnetic core 270. Wound about second ferromagnetic core 270 is second driver coil 260 for exciting core 270 in order to generate a magnetic flux. Also, wound about core 270 and interposed between windings of driver coil 260 is a second sensor coil 280. Second sensor coil 280 is in sensing relationship with the magnetic flux for sensing changes in the magnetic flux and for generating a second sensor coil output signal 290 in response thereto. A third amplifier 300 is electrically connected to second sensor coil 280 for receiving and amplifying second sensor coil output signal 290 in order to generate a third amplifier output signal 310. A second current-to-voltage converter 320 is electrically connected to third amplifier 300 for receiving third amplifier output signal 310 and for converting an electrical current thereof to a voltage in order to generate a second converter voltage output signal 330. A second integrator 340 is electrically connected to second current-to-voltage converter 320 for receiving and integrating second converter output signal 330 to generate a second integrator output signal 360. A high-pass second filter 370 is electrically connected to second integrator 340 for receiving and filtering integrator output signal 360 in order to generate a second filter output signal 380. Second filter 370 removes residual DC that may have leaked past second integrator 340. A fourth amplifier 390 is electrically connected to second filter 370 for receiving and amplifying second filter output signal 380 and for generating a fourth amplifier output signal 400. A second voltage-to-current converter 410 is electrically connected to fourth amplifier 390 for receiving the amplified second filter output signal 380 and for converting the voltage thereof into a current. In this manner, second voltage-to-current converter 410 converts the voltage into a current in order to generate a second voltage-to-current converter output signal 420.

Referring again to FIG. 4, the second voltage-to-current converter output signal 420 generated by second voltage-to-current converter 410 is received by a third driver coil 430 that belongs to third oscillatory sensor $S_3$. In this regard, third oscillator sensor $S_3$ comprises a third ferromagnetic core 440. Wound about third ferromagnetic core 440 is third driver coil 430 for exciting third ferromagnetic core 440 in order to generate a magnetic flux. Also, wound about third core 440 and interposed between windings of third driver coil 440 is a third sensor coil 450. Third sensor coil 450 is in sensing communication with the magnetic flux for sensing changes in the magnetic flux and for generating a third sensor coil output signal 460 in response thereto. A fifth amplifier 470 is electrically connected to third sensor coil 450 for receiving and amplifying third sensor coil output signal 460 in order to generate a fifth amplifier output signal 480. A third current-to-voltage converter 490 is electrically connected to fifth amplifier 470 for receiving fifth amplifier output signal 480 and for converting an electrical current thereof to a voltage in order to generate a third converter voltage output signal 500. A third integrator 510 is electrically connected to third current-to-voltage converter 490 for receiving and integrating third converter output signal 500 in order to generate a third integrator output signal 520. A high-pass third filter 530 is electrically connected to third integrator 510 for receiving and filtering third integrator output signal 520 in order to generate a third filter output signal 540. A sixth amplifier 550 is electrically connected to third filter 530 for receiving and amplifying third filter output signal 540 and for generating a sixth amplifier output signal 560. A third voltage-to-current converter 570 is electrically connected to sixth amplifier 550 for receiving the amplified third filter output signal 540 and for converting the voltage thereof into a current. In this manner, third voltage-to-current converter 570 converts the voltage into a current in order to generate a third voltage-to-current converter output signal 580. Voltage-to-current converter output signal 580 is input to first driver coil 120 for reasons provided hereinbelow.

Figure 5:
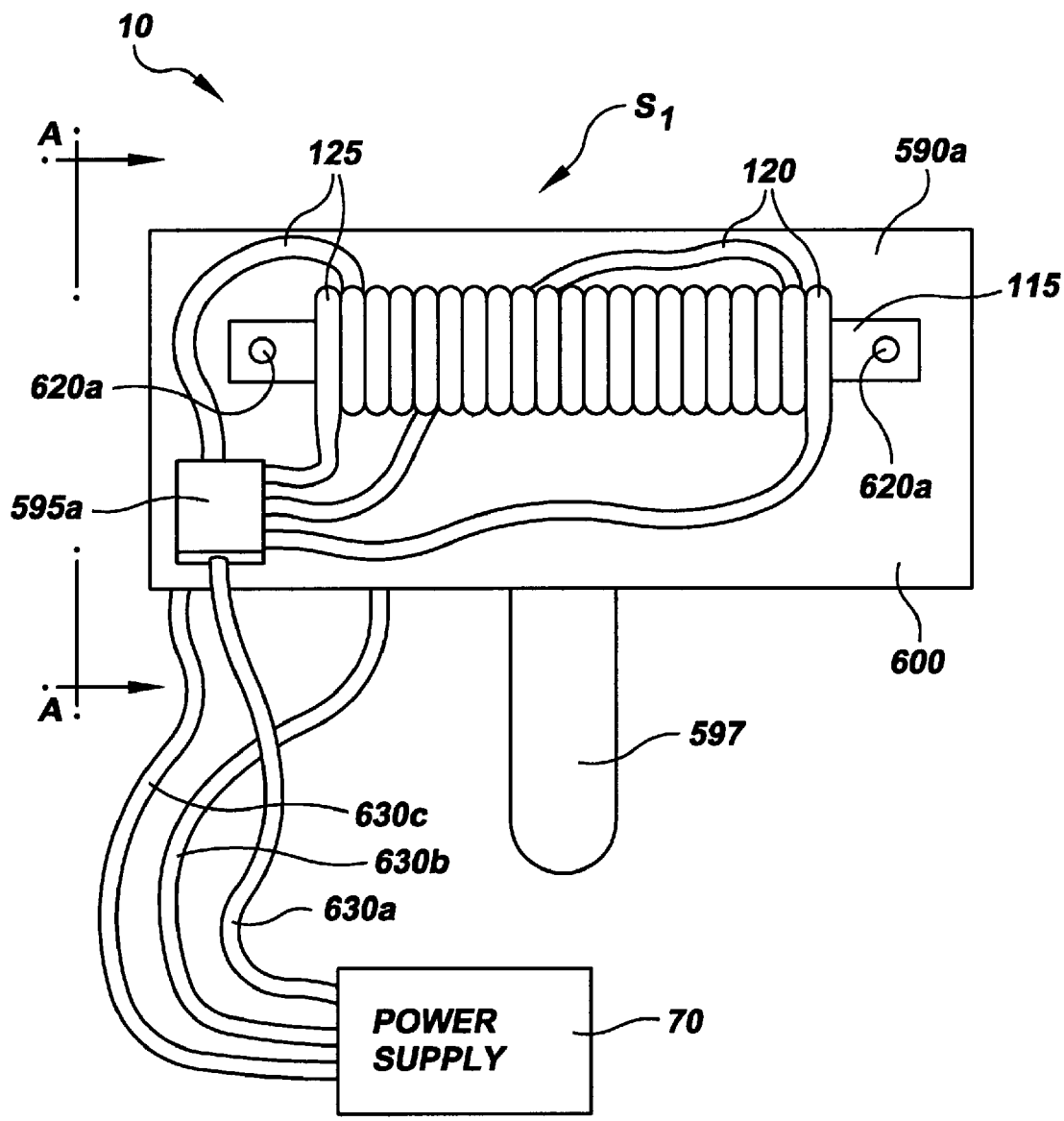
FIG. 5 is a view in elevation of a representative embodiment of the system.
Figure 6:
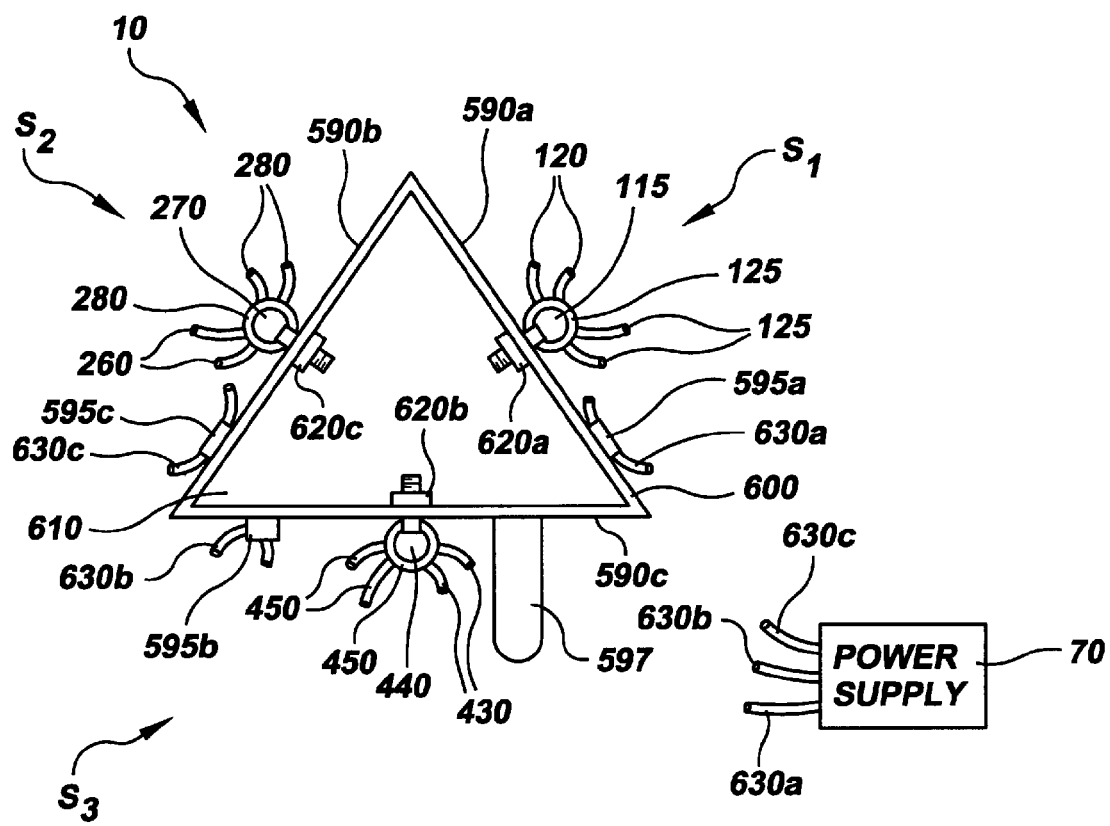
FIG. 6 is a view of the system taken along line A-A of FIG. 5.

Referring to FIGS. 5 and 6, and in accordance with a representative embodiment of system 10, a plurality of panels, such as first panel 590a, second panel 590b, and third panel 590c are joined together to define a support frame 600 that is triangularly-shaped in transverse cross-section. Support frame 600 defines a chamber 610 therethrough for generally aligning system 10 with object 20. Support frame 600 may be made from any convenient light-weight material, such as light-weight aluminum or the like, so that system 10 is easily portable. Alternatively, system 10 may be affixed to a stationary structure, such as the deck of warship 30. Mounted on respective ones of first panel 590a, second panel 590b, and third panel 590c are the previously mentioned first oscillatory sensor S1, second oscillatory sensor S2 and third oscillatory sensor S3. A first enclosure 595a encloses components of first sensor S1 (except for first driver coil 120, first sensor coil 125 and first core 115) to protect the sensor from damage. A second enclosure 595b encloses components of second sensor S2 (except for second driver coil 260, second sensor coil 280 and second core 270) to protect the sensor from damage. A third enclosure 595c encloses components of third sensor S3 (except for third driver coil 430, third sensor coil 450 and third core 440) to protect the sensor from damage. Driver coils 120/260/430 and sensor coils 125/280/450 and cores 115/270/440 are not enclosed in order to facilitate unimpeded detection of the target signal. First oscillatory sensor S1, second oscillatory sensor S2 and third oscillatory sensor S3 cooperate to detect time-dependent changes in an external magnetic flux that is due to presence of object 20 moving in the earth's magnetic field 30. Although support frame 600 is illustrated as having three panels 590a, 590b and 590c arranged to form a triangle in transverse cross-section, there may be a plurality of panels for supporting respective ones of a plurality of oscillatory sensors to form the corresponding cross section. Hence, support frame 600 may be any convenient configuration defining a regular polygon (in transverse cross section) having an odd number of sides or panels. In other words, there are an odd number (e.g., three, five, seven, etc.) of oscillatory sensors supported by respective ones of the odd-number of panels. Therefore, use of three oscillatory sensors S1, S2, and S3 mounted on their respective panels, so as to form a triangle in transverse cross-section, are merely for purposes of example only and are not intended to limit the scope of the claimed inventions. Moreover, a handle 597 is connected to support frame 600, so that an operator may easily hold, carry and manipulate support frame 600. Providing means for holding, carrying and manipulating support frame 600 allows the operator of system 10 to generally align system 10 with object 20 by aligning chamber 610 with object 20 for effective detection of object 20.

Still referring to FIGS. 5 and 6, and as previously mentioned, each of first oscillatory sensor S1, second oscillatory sensor S2 and third oscillatory sensor S3 comprises first ferromagnetic core 115, second ferromagnetic core 270, and third ferromagnetic core 440, respectively. By way of example only, and not by way of limitation, ferromagnetic cores 115, 270, and 440 may each be an elongate, generally cylindrical member, as shown. Alternatively, cores 115, 270, and 440 may be—torodial-shaped (not shown) or any suitable shape selected by an operator of system 10 for detection of object 20. Cores 115, 270 and 440 are connected to respective ones of panels 590a, 590b, and 590c, such as by fasteners. These fasteners may be a first screw/nut combination fastener 620a and a second screw/nut combination fastener (not shown) connecting core 115 to panel 590a; a third screw/nut combination fastener 620c and a fourth screw/nut combination fastener (not shown) connecting second core 270 to panel 590b; and a fifth screw/nut combination fastener 620b and a sixth screw/nut combination fastener (not shown) connecting third core 440 to panel 590c. Alternatively, cores 115, 270 and 440 may be connected to respective ones of panels 590a, 590b and 590c by any convenient means, such as by a suitable adhesive.

Referring again to FIGS. 5 and 6, and as previously mentioned, first driver coil 120, second driver coil 260 and third driver coil 430 are wound about first ferromagnetic core 115, second ferromagnetic core 270 and third ferromagnetic core 440, respectively. First driver coil 120, second driver coil 260 and third driver coil 430 excite respective ones of cores 115, 270 and 440 so as to generate the magnetic flux that will surround cores 115, 270 and 440. In addition, and as previously mentioned, first sensor coil 125, second sensor coil 280 and third sensor coil 450 are wound about first ferromagnetic core 115, second ferromagnetic core 260, and third ferromagnetic core 440, respectively, for reasons described presently. In this regard, sensor coils 125, 280, and 450 are each in sensing communication with the magnetic flux generated by respective ones of cores 115, 270 and 440. Sensor coils 125, 280, and 450 sense or detect changes in the magnetic flux and generate sensor coil output signals 130, 290, and 460 (see FIG. 4), respectively, in response thereto. Sensor coil output signals 130, 290 and 460 are used to measure the magnetic flux and changes thereto.

As shown in FIGS. 1, 2, 3, and 4, a power supply 300 is coupled to first oscillatory sensor $S_1$, second oscillatory sensor $S_2$, and third oscillatory sensor $S_3$ for supplying electrical power to sensors $S_1$, $S_2$ and $S_3$. In order to achieve this result, extending from power supply 70 are a plurality of power supply conduits, such as first power supply conduit 630a, second power supply conduit 630b, and third power supply conduit 630c for conducting electricity from power supply 70 to components comprising respective ones of first oscillatory sensor $S_1$, second oscillatory sensor $S_2$ and third oscillatory sensor $S_3$.

As best seen in FIG. 4, there is shown, with parts removed for clarity, power from power supply 70 being supplied to each component of each sensor $S_1$, $S_2$, and $S_3$. For purposes of clarity, the Table hereinbelow lists the component receiving power, the reference numeral of the voltage signals shown in FIG. 4, and the component (i.e., power supply 70) supplying power to each component of each sensor $S_1$, $S_2$, and $S_3$.

TABLE

| Component Receiving Power | Voltage Reference Numeral Identifying Power Signal From Component Providing Power To Component Receiving Power Shown In FIG. 4 | Component Providing Power |
| --- | --- | --- |
| First Amplifier 140 | $V_{1a}$ | Power Supply 70 |
| First Current-to-Voltage Converter 160 | $V_{2a}$ | Power Supply 70 |
| First Integrator 180 | $V_{3a}$ | Power Supply 70 |
| First High Pass Filter 200 | $V_{4a}$ | Power Supply 70 |
| Second Amplifier | $V_{5a}$ | Power Supply 70 |
| First Voltage-to-Current Converter | $V_{6a}$ | Power Supply 70 |
| Third Amplifier 300 | $V_{1b}$ | Power Supply 70 |
| Second Current-to-Voltage Converter 320 | $V_{2b}$ | Power Supply 70 |
| Second Integrator 340 | $V_{3b}$ | Power Supply 70 |
| Second High Pass Filter 370 | $V_{4b}$ | Power Supply 70 |
| Fourth Amplifier 390 | $V_{5b}$ | Power Supply 70 |
| Second Voltage-to-Current Converter 410 | $V_{6b}$ | Power Supply 70 |
| Fifth Amplifier 470 | $V_{1c}$ | Power Supply 70 |
| Third Current-to-Voltage Converter 490 | $V_{2c}$ | Power Supply 70 |
| Third Integrator 510 | $V_{3c}$ | Power Supply 70 |
| Third High Pass Filter 530 | $V_{4c}$ | Power Supply 70 |
| Sixth Amplifier 550 | $V_{5c}$ | Power Supply 70 |
| Third Voltage-to-Current Converter 570 | $V_{6c}$ | Power Supply 70 |

As best seen in FIG. 4, connected to previously mentioned display monitor 197 is previously mentioned control unit 90 (e.g., a "personal" computer) for controlling operation of system 10. Display 197 receives a display input signal 650 provided by first integrator 180 or second integrator 340 or third integrator 510 and displays a visual representation of display input signal 650. As display 197 receives display input signal 650, display 197 generates a display output signal 655 that is received by control 90. Control unit 90 also provides control that enables an operator of system 10 to select values for "λ". The value "λ" is a coupling gain coefficient for system 10. Control unit 90 is also capable of storing data, such as a plurality of display input signals 650 for subsequent retrieval and analysis. Control unit 90 may include any suitable storage medium, such as a "floppy" disk, a computer internal hard drive, a computer external drive, flash drive, read-write computer disk (i.e., "CD-RW"), a read-write digital versatile disc (i.e., "DVD-RW"), or an on-line data back-up Internet Web service.

Referring to FIGS. 1 and 4, system 10 may be used to uniquely identify object 20. In this regard, the storage medium mentioned hereinabove may have stored therein previously recorded time-dependent AC target signals. The previously recorded target signals may have been obtained by using system 10 to sense time-dependent target signals of various ferromagnetic objects in various environments. Such signals will be unique to the object's signature (i.e., target signal) in that particular environment. For example, a warship at sea will evince a different time-dependent target signal than a person carrying a concealed metal weapon through an airport security check-point. In either case, the time-dependent target signal may be stored in the storage medium. A series of measurements using system 10 may be required to build-up a library of stored time-dependent target signals and their process component signals in power spectral density format. Subsequently, when system 10 is used to detect object 20, that object's time-dependent target signal may be compared to the library of time-dependent target signals in order to uniquely identify the object. This aspect of the invention is useful, for example, in environments where visibility of object may be limited, such as when the object is in a dimly lighted area, or when fog or other atmospheric condition may obscure visual identification of object 20 or provide no visual sign of the object at all. This aspect of the invention is also useful because identification only by the magnetic signature of an object and comparison of that signature to the electronic signatures stored in the library may occur faster due to the nature of electronically accessing data on the storage medium compared to relying on a necessarily slower visual identification by a human observer.

Returning to FIG. 4, when an odd number of oscillatory sensors, such as first oscillatory sensor $S_1$, second oscillatory sensor $S_2$ and third oscillatory sensor $S_3$, are coupled, the dynamics of first oscillatory sensor $S_1$, second oscillatory sensor $S_2$ and third oscillatory sensor $S_3$ may be mathematically described as follows:

$$\dot{x}_1 = -x_1 + \tan h\, c(x_1 + \lambda x_2 + \epsilon(t)) \qquad \text{Equation (1)}$$

$$\dot{x}_2 = -x_2 + \tan h\, c(x_2 + \lambda x_3 + \epsilon(t)) \qquad \text{Equation (2)}$$

$$\dot{x}_3 = -x_3 + \tan h\, c(x_3 + \lambda x_1 + \epsilon(t)) \qquad \text{Equation (3)}$$

where, $\dot{x}_1$ is the time derivative of the mean field flux inside ferromagnetic core 115;

is the average mean field of magnetic flux inside the ferromagnetic core 270 and is dimensionless;

c is a non-linear parameter defined by the material selected for cores 115, 270 and 440 and the value for "c" is inversely proportional to temperature;

λ is the coupling strength and is also referred to in the art as coupling gain coefficient;

$x_2$ is the average mean field of magnetic flux inside ferromagnetic core 270 and is dimensionless;

$\epsilon(t)$ is a non-constant, time varying and necessarily weak external AC target signal; and $x_3$ is the average mean field of magnetic flux inside the ferromagnetic core 440 and is converted into a dimensionless form.

It is noted that $\lambda_c$, which is defined herein as a critical threshold value of coupling strength, is negative given the sign convention used in the equations hereinabove. It may be appreciated by a person of ordinary skill in the art that the oscillations are non-sinusoidal, with a frequency that increases as λ decreases away from $\lambda_c$, (i.e. the oscillation frequency increases as λ becomes more negative compared to $\lambda_c$). For $\lambda > \lambda_c$, the system decays to a steady state condition, with no oscillations present.

The critical threshold value of coupling strength at the onset of oscillations $\lambda_{c,0}$ is defined by the following expression:

$$\lambda_{c,0} = \frac{1}{c}\ln(\sqrt{c} + \sqrt{c-1}) + \tanh[\ln(\sqrt{c} + \sqrt{c-1})] \quad \text{Equation (4)}$$

where, as previously mentioned, "c" is a non-linear parameter defined by the material selected for cores 115, 270 and 440. The value for "c" is the same value because cores 115, 270 and 440 are "matched" (i.e., made of the same material and have the same dimensions).

It may be noted that the critical threshold value of coupling strength in the presence of a magnetic field caused by an external target at the onset of oscillations is provided by the following equation:

$$\lambda_{c,\epsilon} = -\epsilon(t) + \lambda_{c,0} \quad \text{Equation (5)}$$

where, as previously mentioned, $\epsilon(t)$ is a non-constant, time varying and necessarily weak magnetic flux caused by an external AC target signal.

There are at least two modes of operating system 10. The first mode is disclosed immediately hereinbelow. In this regard, when $|\lambda| < |\lambda_{c,0}|$, system 10 does not oscillate in absence of a target signal or when the target signal is time-independent (i.e., DC). Conversely, in the presence of a time-dependent (i.e., AC) target signal, with sufficient amplitude and low frequency, system 10 responds to the target signal by oscillating at the same frequency as the target signal. The oscillations in each matched oscillatory sensor $S_1$, $S_2$ and $S_3$ of system 10 have the same amplitude; however, their phases are offset by $2\pi/N$, where N is the number of oscillatory sensors in system 10 and is an odd-numbered positive integer. By way of example only, and not by way of limitation, N=3 for the exemplary embodiment disclosed herein.

It may be understood from the teachings herein that, with respect to operating in the first mode, system 10 is non-oscillating in the absence of a target signal. This useful result conserves power required from power supply 70 because system 10 can exist in a "sleep state" when system 10 is not oscillating. System 10 will awake from its "sleep state" only when an object 20, such as warship 40, appears having an AC target signal. This in turn extends operational life of system 10 because power supply 70 need not be replaced or recharged as often, when power supply 70 is a battery supplying direct current (DC) power. However, it may be appreciated that power supply 70 need not be a battery. Rather, power supply may comprise a solar panel or an alternating current (AC) power supply, or other source of power.

Also, it may be understood from the teachings herein that, with respect to operating in the first mode, system 10 is "self-oscillating". That is, first oscillatory sensor $S_1$, second oscillatory sensor $S_2$ and third oscillatory sensor $S_3$ will only oscillate when a time-dependent target signal is present.

It may be appreciated that critical coupling parameter $\lambda_c$ is predetermined, such that the value thereof will cause system 10 to be just barely sub-critical. In this manner, the target signal induces oscillation in system 10 when the amplitude of the target signal exceeds a "bifurcation distance", which equals $\lambda_c - \lambda_{c,0}$. Therefore, any oscillations that occur at that time are the result of the presence of the target signal. Such oscillations may be measured or quantified by known readout techniques, such as a PSD (Power Spectral Density) or an RTD (Residence Time Difference) readout. Moreover, such a readout may be displayed on display monitor 197.

As previously mentioned, there are at least two modes of operating system 10. The second mode is disclosed immediately hereinbelow. In this regard, when $|\lambda| > |\lambda_{c,0}|$ system 10 oscillates with a predetermined frequency and amplitude. In the presence of the AC target signal, system 10 continues to oscillate at the predetermined frequency and amplitude; however, this amplitude is modulated by the target signal. A PSD readout from coupled oscillatory sensors $S_1$, $S_2$ and $S_3$ will display a plurality of signals. The weak target signal can be either below the frequency of matched oscillatory sensors $S_1$, $S_2$, $S_3$ or above the frequency of matched oscillatory sensors $S_1$, $S_2$, and $S_3$, as long as the frequency of the target signal is within the responsive frequency band of sensors $S_1$, $S_2$, and $S_3$. It has been observed that, for this case, the PSD technique is a more time-efficient way to measure or quantify readings rather than the RTD technique due to presence of the multiplicity of signals.

Further, it may be understood from the teachings herein that, with respect to operating in the second mode, system 10 is "self-modulating". That is, first oscillatory sensor $S_1$, second oscillatory sensor $S_2$ and third oscillatory sensor $S_3$ will oscillate at the predetermined frequency and amplitude; however, the amplitude is modulated by the AC target signal.

Figure 7:
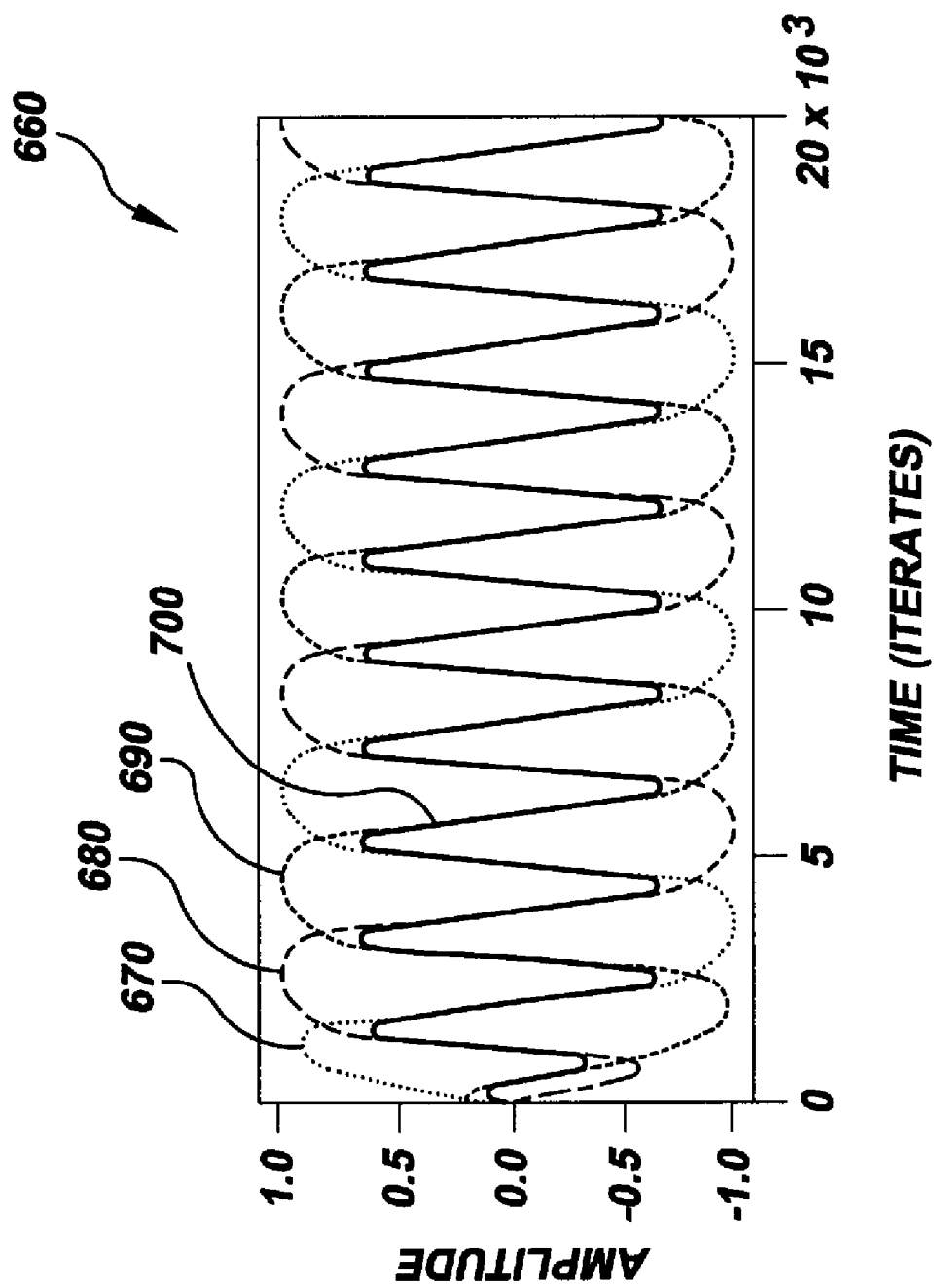
FIG. 7 is a graphical representation of an output signal generated by each one of the three sensors belonging to the system.

Turning now to FIG. 7, a plurality of wave forms, generally referred to as 660, are defined by display input signal 650. Wave forms 660 are generated by sensors $S_1$, $S_2$ and $S_3$. In this regard, sensors $S_1$, $S_2$ and $S_3$ generate first sensor wave form 670, second sensor wave form 680 and third sensor wave form 690, respectfully. First sensor wave form 670, second sensor wave form 680 and third sensor wave form 690 are illustrated in FIG. 7 as separately distinct dashed lines for purposes of identification. It is noted that first sensor wave form 670, second sensor wave form 680 and third sensor wave form 690 are not sinusoidal. With respect to FIG. 7, wave forms 670, 680 and 690 were plotted using parametric values c=3, λ=−0.650 and $\epsilon$=0. A composite wave form 700, indicated by a solid line in FIG. 7, represents a composite or summed response of the individual wave forms 670, 680 and 690. In this regard, signal output signals from each of sensors $S_1$, $S_2$ and $S_3$ are taken after respective ones of first integrator 180, second integrator 340 and third integrator 510 and these output signals are summed by a summer (not shown). The summer produces summed signal 700. It is noted that the summed response is sinusoidal, having frequency N ω, where ω is oscillation frequency. In this embodiment of the invention, N=3 due to presence of three sensors $S_1$, $S_2$ and $S_3$. It was discovered that the summed response is particularly sensitive to presence of a weak target signal. Thus, use of this embodiment of the invention in this manner enhances sensitivity or resolution for weak AC target field detection. In other words, system 10 resolution (defined as the mean residence time difference in the stable states of a threshold detector into which the summed output of the sensor system is fed) can be enhanced by carefully tuning the array (via the system parameter λ) to just beyond the onset of the oscillations. It is believed that system 10 is therefore sensitive to small changes in target signal strength and frequency.

Figure 8:
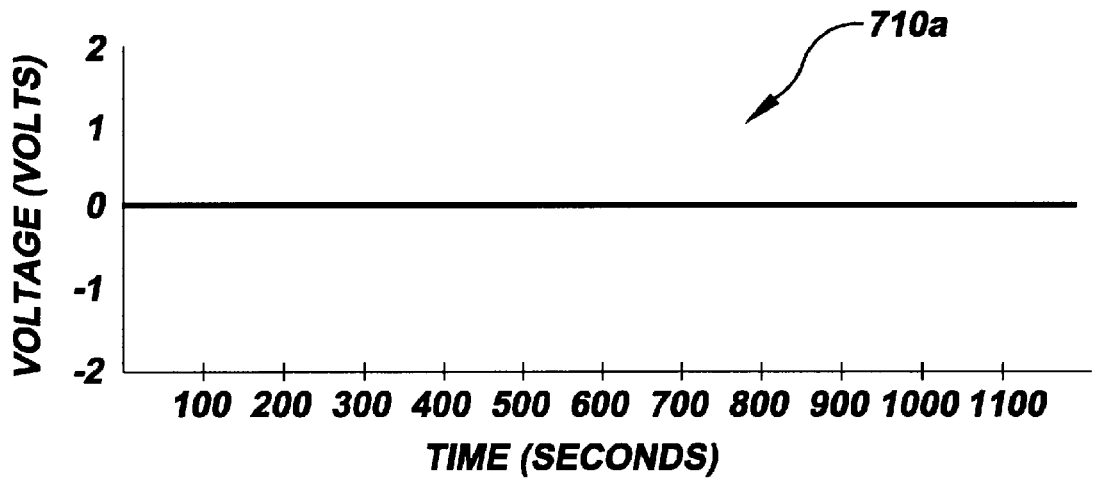
FIG. 8 is a graphical representation of the system at rest before presence of an AC target signal.
Figure 9:
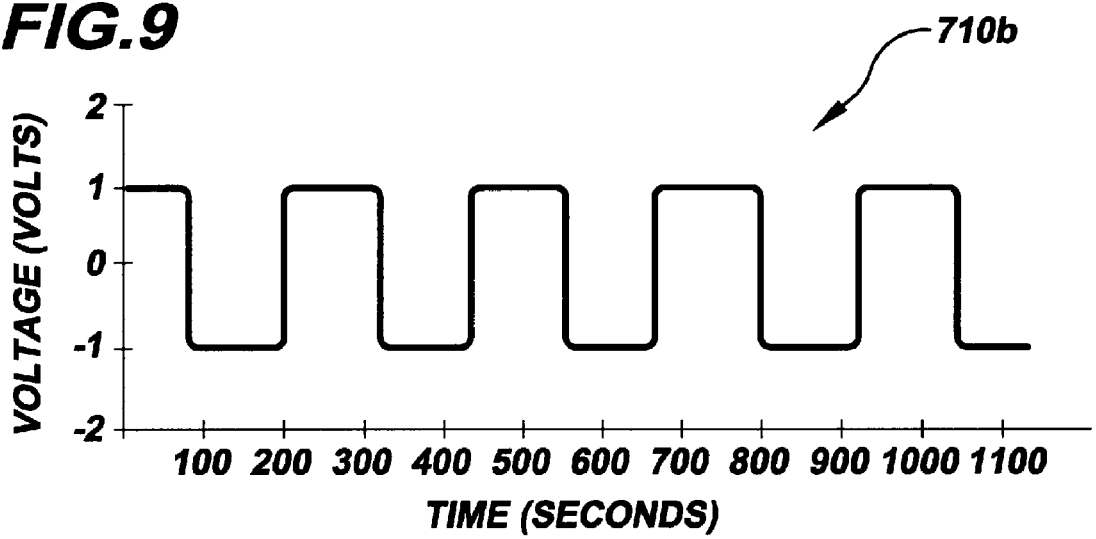
FIG. 9 is a graphical representation of the system during presence of the AC target signal.
Figure 10:
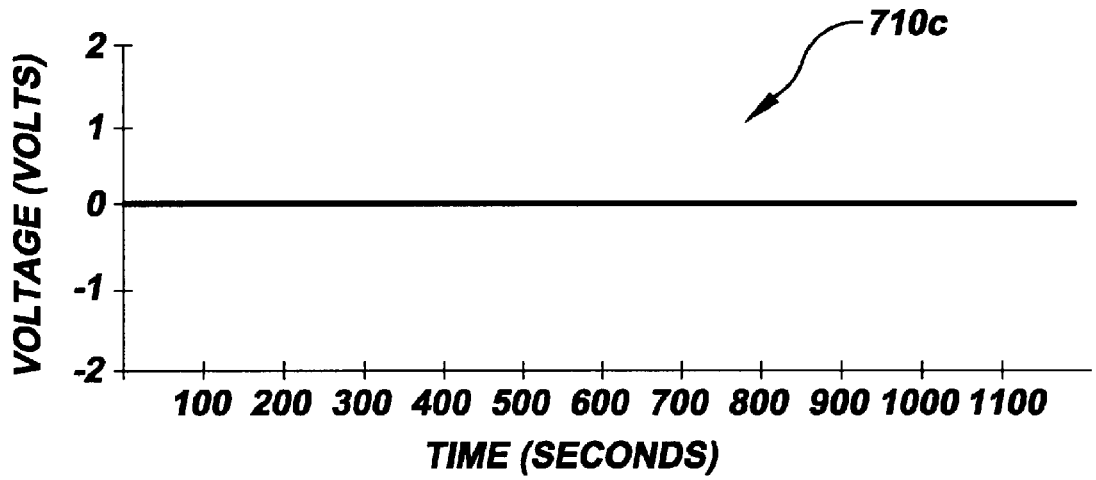
FIG. 10 is a graphical representation of the system at rest after presence of the AC target signal.

FIGS. 8, 9 and 10 show a first system wave form 710a and a second system wave form 710b produced by system 10 before object 20 moves through field 30 (i.e., no AC target signal present) and as object 20 is moving through field 30 (i.e., AC target signal present), respectively. Also shown is a third system wave form 710c that is present after object 20 moved through field 30 (i.e., no AC target signal present). As expected, wave form 710c is the same as wave form 710a. Parameter settings used to generate the wave forms shown in each of FIGS. 8, 9 and 10 are c=3, λ=−0.42, ϵ=0.05 and a frequency of 0.026. FIG. 8 shows sensors $S_1$, $S_2$ and $S_3$ at rest because object 20 is not moving through field 30 and, thus, there is no AC signal to be detected by sensors $S_1$, $S_2$ and $S_3$. FIG. 9 shows that, when object 20, having an AC target signal, moves through field 30, sensors $S_1$, $S_2$ and $S_3$, oscillate at the same frequency as the AC target signal. FIG. 10 shows that once object 20 passes through and out of field 30 and there is no AC target signal, sensors $S_1$, $S_2$ and $S_3$ will return to being at rest. This is a beneficial result because, for typical uses of system 10, the system 10 is at rest most of the time and, therefore, consumes relatively less power until arrival of the AC target signal. At that point, sensors $S_1$, $S_2$ and $S_3$ that belong to system 10 "wake-up" and oscillate at the same frequency as the target signal.

Figure 11:
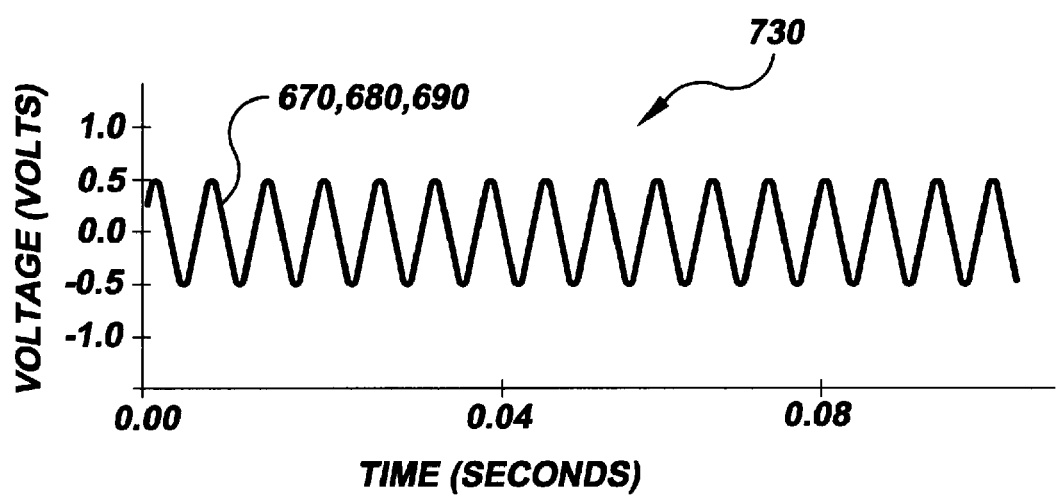
FIG. 11 shows a wave form having oscillations in phase with each other and frequency locked to the external target signal.

FIG. 11 shows a wave form, generally referred to as 730, having oscillations in phase with each other and frequency locked to the external target signal. That is, frequency of the oscillations precisely match that of the target signal.

Figure 12:
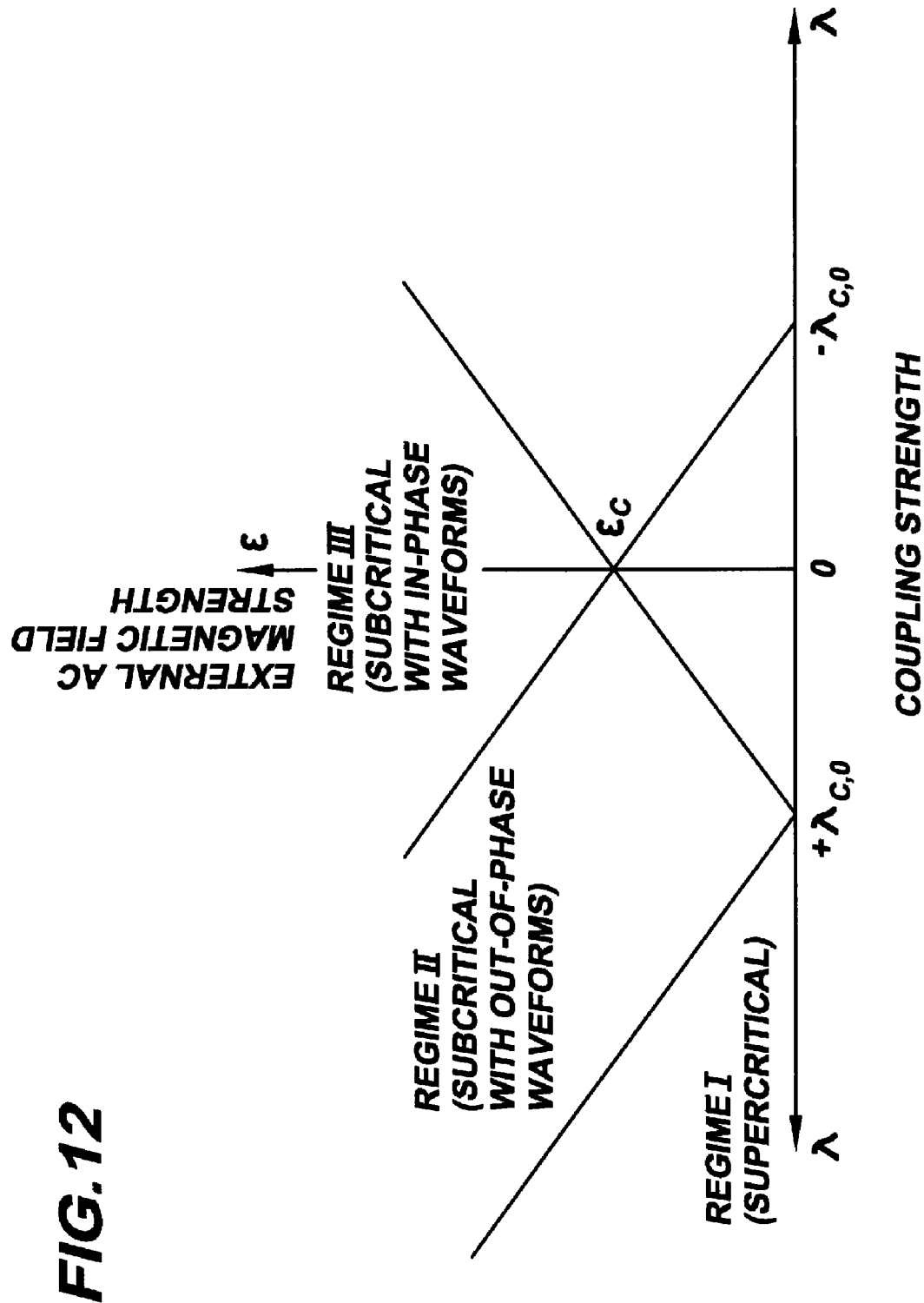
FIG. 12 is a graphical representation of operating regimes exhibited by the system.

Referring to FIG. 12, it will be appreciated that there are three distinct regimes of oscillatory behavior exhibited by system 10, so as to detect a time dependent (i.e., AC) target signal. In this regard, a Regime I is defined when coupling parameter λ is chosen to be below the critical value at the onset of oscillations (i.e., $\lambda<\lambda_{c,0}$ or $|\lambda|>|\lambda_{c,0}|$). In Regime I, which is referred to herein as a "supercritical regime", system 10 responds by oscillating between the two stable magnetization states of each oscillatory sensor $S_1$; $S_2$ and $S_3$. Parametric settings for Regime I may be c=3, λ=−0.60, ϵ=0.05 and frequency at 0.0738.

Still referring to FIG. 12, a Regime II, which is referred to herein as the "subcritical regime with out-of-phase wave forms, is defined when coupling parameter λ exceeds the critical value $\lambda_{c,0}$ (i.e., $\lambda>\lambda_{c,0}$ or $|\lambda|<|\lambda_{c,0}|$. Also, in Regime II, system 10 responds by oscillating with a traveling wave pattern as shown in FIG. 7. Operation within Regime II results in no spontaneous oscillations. The oscillation frequency is ω/N or ω/3 in the exemplary embodiment of three oscillatory sensors $S_1$, $S_2$ and $S_3$. Parametric settings for Regime II may be c=3, λ=−0.42, ϵ=0.05 and frequency is 0.026.

Further, in Regime III, which is referred as the "subcritical regime with in-phase wave forms", system 10 responds by oscillating with a traveling wave pattern as shown in FIG. 11. Regime III is defined when coupling parameter λ is below the critical value $\lambda_{c,0}$ (i.e., $\lambda<\lambda_{c,0}$ or $|\lambda|>|\lambda_{c,0}|$). Also, in Regime III, the output wave form frequency is matched to that of the target signal frequency. With coupling parameter λ held constant in the subcritical Regime II, increasing ϵ past a critical value $\epsilon_c$ causes system 10 to switch to another oscillation mode, such as into Regime III wherein the frequency of the output wave form frequency matches that of the target signal frequency.

Referring again to FIG. 12, system 10 may be set-up with λ in the supercritical regime (i.e., Regime I), so that system 10 oscillates without an applied external field or target signal. System 10 then remains oscillating when an external field ϵ is applied while still in the supercritical regime (i.e., Regime I). Increasing amplitude of the AC target signal pushes system 10 into the out-of-phase subcritical regime (i.e., Regime II). Also, increasing amplitude can result in system 10 switching to another behavior in the subcritical regime (i.e., Regime III) wherein all three wave forms are phase locked to each other and the oscillation frequency matches that of the external target signal.

Therefore, what is provided is a coupled nonlinear sensor system including oscillatory fluxgate magnetometers, and a method of assembling the system, capable of oscillating in response to time-dependent (i.e., A.C.) changes in an external magnetic flux field generated by a target signal in order to detect the target signal with enhanced resolution and lower power consumption.

What is claimed is:

1. A coupled nonlinear sensor system for sensing a non-sinusoidal time-dependent target signal, comprising an odd number, other than one, of interconnected oscillatory sensors for sensing time-dependent changes in an external magnetic flux generated by the non-sinusoidal time-dependent target signal, said sensors coupled to each other by a coupling parameter characterized by a threshold value, so that each of said sensors oscillates in the presence of the non-sinusoidal time-dependent target signal as the coupling parameter exceeds the threshold value.

2. The system of claim 1, further comprising a control unit coupled to said oscillatory sensors for controlling said oscillatory sensors.

3. The system of claim 2, wherein said control unit is capable of storing a plurality of predetermined non-sinusoidal time-dependent target signals corresponding to respective ones of a plurality of predetermined objects.

4. A coupled nonlinear sensor system for sensing a non-sinusoidal time-dependent target signal having a frequency of oscillation, comprising an odd number, other than one, of interconnected oscillatory sensors oscillating in response to time-dependent changes in an external magnetic flux generated by the non-sinusoidal time-dependent target signal, said sensors coupled one to another by a coupling parameter having a predetermined threshold value, each of said sensors oscillating at a frequency responsive to presence of the non-sinusoidal time-dependent target signal as the coupling parameter exceeds the threshold value.

5. The system of claim 4, wherein each of said sensors is capable of oscillating at a frequency synchronized to the frequency of oscillation of the non-sinusoidal time-dependent target signal, each of said sensors capable of only oscillating in presence of the non-sinusoidal time-dependent target signal for sensing the non-sinusoidal time-dependent target signal.

6. The system of claim 4, wherein each of said sensors is capable of oscillating in absence of the non-sinusoidal time-dependent target signal at an amplitude modulatable by presence of the non-sinusoidal time-dependent target signal for sensing the non-sinusoidal time-dependent target signal.

7. The system of claim 4, further comprising a control unit coupled to said oscillatory sensors for controlling said oscillatory sensors.

8. The system of claim 7, wherein said control unit is capable of storing a plurality of predetermined non-sinusoidal time-dependent target signals corresponding to respective ones of a plurality of predetermined objects, so that the detected non-sinusoidal time-dependent target signal is capable of being compared to the stored non-sinusoidal time-dependent target signals for uniquely identifying the object generating the detected non-sinusoidal time-dependent target signal.

9. The system of claim 4, wherein each of said sensors is a fluxgate magnetometer.

10. A coupled nonlinear sensor system for sensing a non-sinusoidal time-dependent target signal having a frequency of oscillation, comprising:
   (a) at least three panels joined to define a triangularly-shaped frame in transverse cross-section:
   (b) at least three interconnected fluxgate magnetometers mounted on respective ones of said panels and adjacent one to another, each of said fluxgate magnetometers including:
       (i) a ferromagnetic core,
       (ii) a driver coil wound about said core for exciting said core to generate a magnetic flux,
       (iii) a sensor coil wound about said core and in sensing communication with the magnetic flux for sensing changes in the magnetic flux and for generating a sensor coil output signal in response to the changes in the magnetic flux, (iv) a first amplifier connected to said sensor coil for receiving and amplifying the sensor coil output signal to generate an amplifier output signal,
       (v) a current-to-voltage converter connected to said amplifier for receiving the amplifier output signal and for converting an electrical current thereof to a voltage, so as to generate a first converter voltage output signal,
       (vi) an integrator electrically connected to the current-to-voltage converter for receiving and integrating the first converter voltage output signal and generating an integrator output signal,
       (vii) a filter connected to said integrator for receiving and filtering the integrator output signal to generate a filter output signal,
       (viii) a second amplifier connected to said filter for receiving and amplifying the filter output signal to generate an amplified filter output signal,
       (ix) voltage-to-current converter connected to said second amplifier for receiving the amplified filter output signal and for converting the voltage into a current to generate a voltage-to-current converter output signal, said voltage-to-current converter being connected to the driver coil belonging to an adjacent one of said fluxgate magnetometers, each of said magnetometers oscillating in response to time-dependent changes in an external magnetic flux generated by the non-sinusoidal time-dependent target signal, said sensors coupled one to another by a coupling parameter having a predetermined threshold value, each of said sensors oscillating at a frequency responsive to presence of the non-sinusoidal time-dependent target signal as the coupling parameter exceeds the threshold value; and
   (c) a power supply coupled to said at least three fluxgate magnetometers for supplying power to said fluxgate magnetometers.

11. The system of claim 10, further comprising a control unit coupled to said fluxgate magnetometers for controlling said fluxgate magnetometers.

12. The system of claim 11, wherein said control unit is capable of storing a plurality of predefined non-sinusoidal time-dependent target signals corresponding to respective ones of a plurality of predetermined objects, so that the detected non-sinusoidal time-dependent target signal is capable of being compared to the stored non-sinusoidal time-dependent target signals for uniquely identifying the object generating the detected non-sinusoidal time-dependent target signal.

13. A method of assembling a coupled nonlinear sensor system for sensing a non-sinusoidal time-dependent target signal, comprising the step of interconnecting an odd number, other than one, of oscillatory sensors for sensing time-dependent changes in an external magnetic flux generated by the non-sinusoidal time-dependent target signal, the sensors coupled to each other by a coupling parameter having a threshold value, so that each of the sensors oscillates in presence of the non-sinusoidal time-dependent target signal as the coupling parameter exceeds the threshold value.

14. The method of claim 13, wherein the step of interconnecting an odd number of oscillatory sensors comprises the step of interconnecting an odd number of oscillatory sensors so that the oscillatory sensors are self-oscillating.

15. The method of claim 13, wherein the step of interconnecting an odd number of oscillatory sensors comprises the step of interconnecting an odd number of oscillatory sensors so that the oscillatory sensors are self-modulating.

16. The method of claim 13, further comprising a step of coupling a control unit to the oscillatory sensors for controlling the oscillatory sensors.

17. The method of claim 13, wherein the step of coupling a control unit comprises the step of coupling the control unit, so that the control unit is capable of storing a plurality of predetermined non-sinusoidal time-dependent target signals corresponding to respective ones of a plurality of predetermined objects.

18. A method of assembling a coupled nonlinear sensor system for sensing a non-sinusoidal time-dependent target signal having a frequency of oscillation, comprising the step of interconnecting an odd number, other than one, of oscillatory sensors oscillating in response to time-dependent changes in an external magnetic flux generated by the non-sinusoidal time-dependent target signal, the sensors coupled one to another by a coupling parameter having a predetermined threshold value, each of the sensors oscillating at a frequency responsive to presence of the non-sinusoidal time-dependent target signal as the coupling parameter exceeds the threshold value.

19. The method of claim 18, wherein the step of interconnecting the sensors comprises the step of interconnecting the sensors so that each of the sensors is capable of oscillating at a frequency synchronized to the frequency of oscillation of the non-sinusoidal time-dependent target signal, and so that each of the sensors only oscillates in presence of the non-sinusoidal time-dependent target signal for sensing the non-sinusoidal time-dependent target signal.

20. The method of claim 18, wherein the step of interconnecting the sensors comprises the step of interconnecting the sensors so that each of the sensors is capable of oscillating in absence of the non-sinusoidal time-dependent target signal at an amplitude modulatable by presence of the non-sinusoidal time-dependent target signal for sensing the non-sinusoidal time-dependent target signal.

21. The method of claim 18, further comprising the step of coupling a control unit coupled to said oscillatory sensors for controlling said oscillatory sensors.

22. The method of claim 21, wherein the step of coupling a control unit comprises the step of coupling the control unit, so that the control unit is capable of storing a plurality of predetermined non-sinusoidal time-dependent target signals corresponding to respective ones of a plurality of predetermined objects, so that the detected non-sinusoidal time-dependent target signal is capable of being compared to the stored non-sinusoidal time-dependent target signals for uniquely identifying the object generating the detected non-sinusoidal time-dependent target signal.

23. The method of claim 18, wherein the step of interconnecting an odd number of oscillatory sensors comprises the step of interconnecting an odd number of fluxgate magnetometers.

24. A method of assembling a coupled nonlinear sensor system for sensing a non-sinusoidal time-dependent target signal having a frequency of oscillation, comprising the steps of:
   (a) joining three panels to define a triangularly-shaped frame in transverse cross-section;
   (b) mounting three interconnected fluxgate magnetometers on respective ones of the panels and adjacent one to another, the step of mounting the interconnected fluxgate magnetometers including the steps of:
      (i) providing a ferromagnetic core,
      (ii) winding a driver coil about the core for exciting the core to generate a magnetic flux,
      (iii) winding a sensor coil about the core, the sensor coil capable of being in sensing communication with the magnetic flux for sensing changes in the magnetic flux and for generating a sensor coil output signal in response to changes in the magnetic flux,
      (iv) connecting a first amplifier to the sensor coil for receiving and amplifying the sensor coil output signal to generate an amplifier output signal,
      (v) connecting a current-to-voltage converter to the first amplifier for receiving the amplifier output signal and for converting an electrical current thereof to a voltage, so as to generate a first converter voltage output signal,
      (vi) connecting an integrator to the current-to-voltage converter for receiving and integrating the first converter voltage output signal and generating an integrator output signal,
      (vii) connecting a filter to the integrator for receiving and filtering the integrator output signal in order to generate a filter output signal,
      (viii) connecting a second amplifier to the filter for receiving and amplifying the filter output signal to generate an amplified filter output signal,
      (ix) connecting a voltage-to-current converter to the second amplifier for receiving the amplified filter output signal and for converting the voltage into a current to generate a voltage-to-current converter output signal, the voltage-to-current converter being connected to the driver coil belonging to an adjacent one of the fluxgate magnetometers, each of the magnetometers oscillating in response to time-dependent changes in an external magnetic flux generated by the non-sinusoidal time-dependent target signal, the sensors coupled one to another by a coupling parameter having a predetermined threshold value, each of the sensors oscillating at a frequency responsive to presence of the non-sinusoidal time-dependent target signal as the coupling parameter exceeds the threshold value; and
   (c) coupling a power supply to the fluxgate magnetometer for supplying power to the fluxgate magnetometer.

\* \* \* \* \*